United States Patent
Lee et al.

(10) Patent No.: US 10,014,056 B1
(45) Date of Patent: Jul. 3, 2018

(54) CHANGING STORAGE PARAMETERS

(71) Applicant: SanDisk Technologies LLC, Plano, TX (US)

(72) Inventors: Aaron Lee, Mountain View, CA (US); Yi-Chieh Chen, San Jose, CA (US); Anne Koh, Fremont, CA (US); Gulzar Kathawala, Campbell, CA (US); Mrinal Kochar, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/598,936

(22) Filed: May 18, 2017

(51) Int. Cl.
| | |
|---|---|
| G11C 7/22 | (2006.01) |
| G11C 16/06 | (2006.01) |
| G11C 16/26 | (2006.01) |
| G11C 11/56 | (2006.01) |
| G11C 16/10 | (2006.01) |
| G11C 16/04 | (2006.01) |
| G11C 29/02 | (2006.01) |

(52) U.S. Cl.
CPC .............. *G11C 16/06* (2013.01); *G11C 7/22* (2013.01); *G11C 11/5628* (2013.01); *G11C 16/10* (2013.01); *G11C 16/26* (2013.01); *G11C 11/5635* (2013.01); *G11C 11/5642* (2013.01); *G11C 16/04* (2013.01); *G11C 16/0483* (2013.01); *G11C 29/028* (2013.01)

(58) Field of Classification Search
CPC ............................... G11C 7/22; G11C 7/1051
USPC ............................................ 365/221, 233.5
See application file for complete search history.

(56) References Cited

U.S. PATENT DOCUMENTS

| | | | |
|---|---|---|---|
| 6,317,646 B1 * | 11/2001 | de Caussin | G05B 19/40937 |
| | | | 700/173 |
| 8,209,477 B2 | 6/2012 | Roohparvar et al. | |
| 8,688,899 B2 | 4/2014 | Nellans et al. | |
| 8,756,702 B2 * | 6/2014 | Kanemoto | G06F 21/445 |
| | | | 707/708 |
| 8,908,518 B1 * | 12/2014 | Arnold | H04L 47/2408 |
| | | | 370/235 |
| 9,208,363 B2 | 12/2015 | McQuaide et al. | |
| 9,245,590 B2 | 1/2016 | Chen et al. | |
| 9,378,334 B2 * | 6/2016 | Lee | G06F 19/3418 |
| 9,432,298 B1 * | 8/2016 | Smith | H04L 49/9057 |
| 9,496,043 B1 * | 11/2016 | Camp | G11C 16/26 |

(Continued)

OTHER PUBLICATIONS

IEEE Standard for Ethernet, IEEE Computer Society, Dec. 28, 2012, IEEE Std 802.3-2012, New York, NY.

*Primary Examiner* — Michael Tran
(74) *Attorney, Agent, or Firm* — Kunzler, PC

(57) ABSTRACT

Apparatuses, systems, methods, and computer program products are disclosed for changing storage parameters. An integrated circuit (IC) memory element receives a command to change a value of a parameter associated with the IC memory element. A parameter includes a setting for one or more storage operations of an IC memory element. An IC memory element receives one or more data sets with a command. A data set includes an identifier associated with a parameter to be changed and a new value for the parameter. Each of one or more data sets is received at a same data rate as a command. An IC memory element writes, for each of one or more data sets, a new value for a parameter to a storage location associated with the parameter.

20 Claims, 7 Drawing Sheets

(56) References Cited

U.S. PATENT DOCUMENTS

| | | | |
|---|---|---|---|
| 2004/0148482 A1* | 7/2004 | Grundy | G06F 12/06 |
| | | | 711/167 |
| 2008/0136817 A1* | 6/2008 | Dederichs | G06T 15/00 |
| | | | 345/426 |
| 2009/0043932 A1 | 2/2009 | Bernardi | |
| 2011/0102221 A1* | 5/2011 | Guido | H03M 1/1225 |
| | | | 341/141 |
| 2011/0106415 A1* | 5/2011 | Guido | F02D 35/027 |
| | | | 701/115 |
| 2013/0159607 A1* | 6/2013 | Kyung | G11C 16/10 |
| | | | 711/103 |
| 2014/0171098 A1* | 6/2014 | Marti | G01S 5/0252 |
| | | | 455/456.1 |
| 2014/0215540 A1* | 7/2014 | Podolsky | H04N 21/61 |
| | | | 725/98 |
| 2015/0007182 A1* | 1/2015 | Rossbach | G06F 9/4843 |
| | | | 718/102 |
| 2015/0037771 A1* | 2/2015 | Kaleal, III | G09B 5/02 |
| | | | 434/257 |
| 2016/0180959 A1* | 6/2016 | Darragh | G06F 3/0653 |
| | | | 365/185.09 |
| 2016/0259593 A1 | 9/2016 | Kinoshita | |
| 2017/0161089 A1* | 6/2017 | Frazier | G06F 9/45558 |

* cited by examiner

CHANGING STORAGE PARAMETERS

TECHNICAL FIELD

The present disclosure, in various embodiments, relates to storage devices and more particularly relates to changing storage parameters of storage devices.

BACKGROUND

An integrated circuit (IC) memory element may store values for various parameters that are associated with operations performed on the IC memory element. Changing, modifying, or adjusting the values of the parameters, however, can be time consuming and therefore can slow down the execution of the IC memory element.

SUMMARY

Apparatuses are presented to change storage parameters. In one embodiment, an apparatus includes an integrated circuit ("IC") memory element. An IC memory element, in certain embodiments, receives a command to change a value of a parameter associated with the IC memory element. A parameter may include a setting for one or more storage operations of an IC memory element. In a further embodiment, an IC memory element receives one or more data sets with a command. A data set may include an identifier associated with a parameter to be changed and a new value for the parameter. Each of one or more data sets may be received at a same data rate as a command. In some embodiments, an IC memory element writes, for each of one or more data sets, a new value for a parameter to a storage location associated with the parameter.

An apparatus, in another embodiment, includes means for reading, within a single clock cycle, groups of data for modifying one or more execution variables of a non-volatile storage device from one or more data latches of the non-volatile storage device. Execution variables may be associated with one or more functions of a non-volatile storage device. An apparatus, in a further embodiment, includes means for identifying execution variables of a non-volatile storage device that are to be modified according to identifiers within groups of data. An apparatus, in some embodiments, includes means for modifying identified execution variables to different values provided within groups of data.

Systems are presented to change storage parameters. A system, in one embodiment, includes a non-volatile memory medium and a controller. In certain embodiments, a controller is configured to receive a plurality of data tuples for changing values of storage operation settings for a non-volatile memory medium. Each data tuple may include an address for a group of settings, a mask for identifying which setting of the group is to be changed, and a value for the identified setting. A plurality of data tuples may be received without a delay between receiving each data tuple. A controller, in another embodiment, is configured to program values of data tuples to settings for a non-volatile memory medium identified by masks of the data tuples.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1:
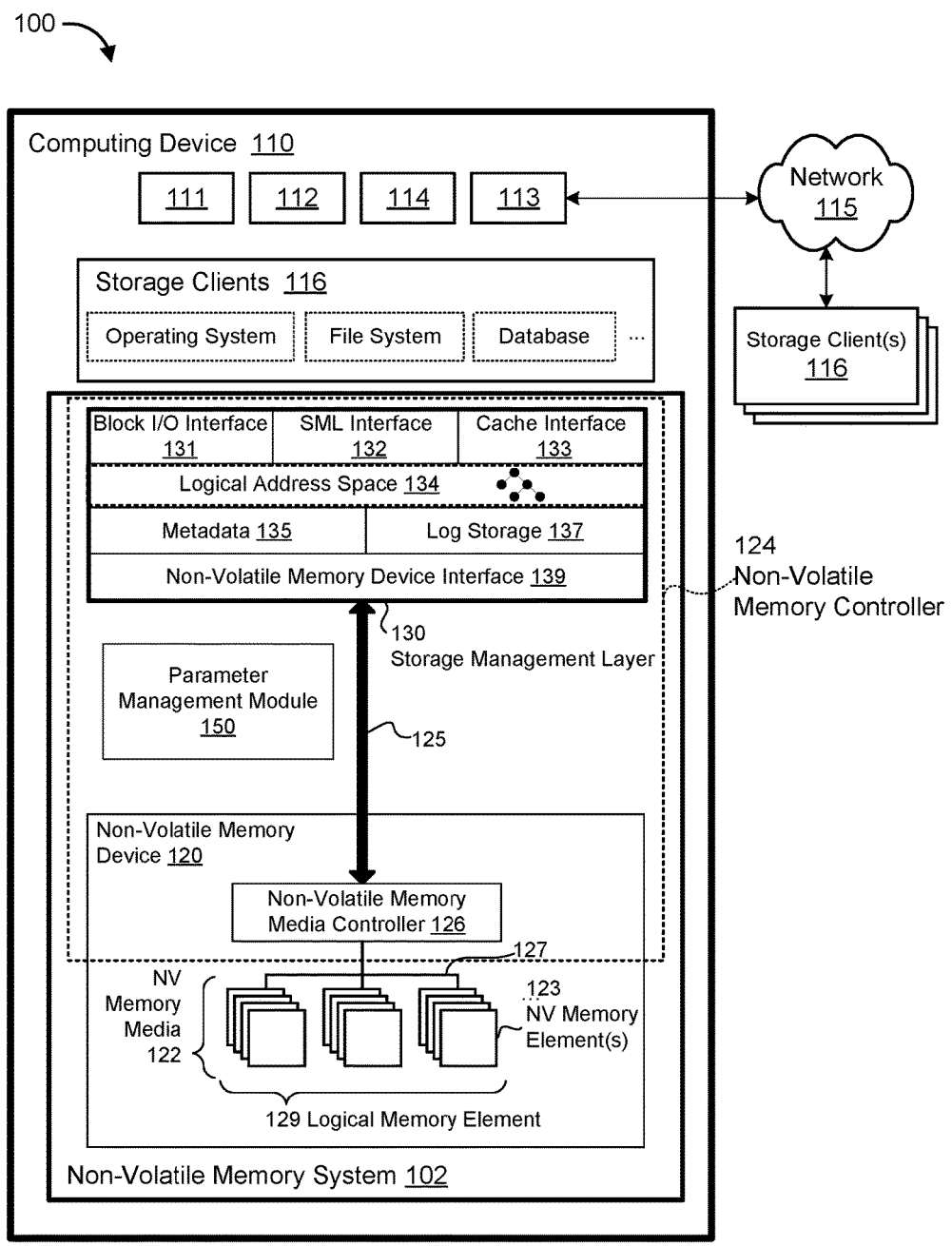
FIG. 1 is a schematic block diagram illustrating one embodiment of a system comprising a parameter management module.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1 is a block diagram of one embodiment of a system 100 comprising a parameter management module 150. The parameter management module 150 may be part of and/or in communication with one or more of a non-volatile memory controller 124, a non-volatile memory media controller 126, a device driver or storage management layer (SML) 130, or the like. The parameter management module 150 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or non-volatile memory controller 124 to a communication network 115, such as an Internet Protocol network, a Storage Area Network, or the like.

The computing device 110 may further comprise a non-transitory, computer readable storage media 114. The computer readable storage media 114 may comprise executable instructions configured to cause the computing device 110 (e.g., processor 111) to perform steps of one or more of the methods disclosed herein. Alternatively, or in addition, the parameter management module 150 may be embodied as one or more computer readable instructions stored on the non-transitory storage media 114.

The non-volatile memory system 102, in the depicted embodiment, includes a parameter management module 150. The parameter management module 150, in one embodiment, is configured to change one or more storage parameters of the non-volatile memory device 120 while the non-volatile memory device 120 is executing in toggle mode. As used herein, toggle mode is a high-performance, high-speed execution mode of the non-volatile memory device 120, similar to double data rate (DDR), that may increase the speed and/or bandwidth of the non-volatile memory device 120 without increasing power consumption. In some embodiments, a non-volatile memory device 120 executing in toggle mode may be embodied as an asynchronous DDR NAND that does not use a separate clock signal when reading or writing data. The parameter management module 150, in one embodiment, improves the performance of changing storage parameters of the non-volatile memory device 120 by receiving or reading data associated with the new parameter values while in toggle mode, and therefore the non-volatile memory device 120 is not switched to a lower-performing or slower mode, e.g., single data rate (SDR) mode, to receive and/or change the parameter values.

In one embodiment, the parameter management module 150 may comprise executable software code, such as a device driver, SML 130, or the like, stored on the computer readable storage media 114 for execution on the processor 111. In another embodiment the parameter management module 150 may comprise logic hardware of one or more non-volatile memory devices 120, such as a non-volatile memory media controller 126, a non-volatile memory controller 124, a device controller, a field-programmable gate array (FPGA) or other programmable logic, firmware for an FPGA or other programmable logic, microcode for execution on a microcontroller, an application-specific integrated circuit (ASIC), or the like. In a further embodiment, the parameter management module 150 may include a combination of both executable software code and logic hardware.

In one embodiment, the parameter management module 150 is configured to receive storage requests from the SML 130 via a bus 125 or the like. The parameter management module 150 may be further configured to transfer data to/from the SML 130 and/or storage clients 116 via the bus 125. Accordingly, the parameter management module 150, in some embodiments, may comprise and/or be in communication with one or more direct memory access (DMA) modules, remote DMA modules, bus controllers, bridges, buffers, and so on to facilitate the transfer of storage requests and associated data. In another embodiment, the parameter management module 150 may receive storage requests as an API call from a storage client 116, as an IO-CTL command, or the like. The parameter management module 150 is described in greater detail below with regard to FIGS. 3 and 4.

According to various embodiments, a non-volatile memory controller 124 comprising the parameter management module 150 may manage one or more non-volatile memory devices 120. The non-volatile memory device(s) 120 may comprise recording, memory, and/or storage devices, such as solid-state storage device(s), that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, erase blocks, sectors, blocks, collections or sets of physical storage locations (e.g., logical pages, logical erase blocks, described below), or the like.

The non-volatile memory controller 124 may comprise an SML 130, which may present a logical address space 134 to one or more storage clients 116. One example of an SML is the Virtual Storage Layer® of SanDisk Corporation of Milpitas, Calif. Alternatively, each non-volatile memory device 120 may comprise a non-volatile memory media controller 126, which may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

The SML 130 may maintain metadata 135, such as a forward index, to map logical addresses of the logical address space 134 to media storage locations on the non-volatile memory device(s) 120. The SML 130 may provide for arbitrary, any-to-any mappings from logical addresses to physical storage resources. As used herein, an "any-to any" mapping may map any logical address to any physical storage resource. Accordingly, there may be no pre-defined and/or pre-set mappings between logical addresses and particular, media storage locations and/or media addresses. As used herein, a media address refers to an address of a memory resource that uniquely identifies one memory resource from another to a controller that manages a plurality of memory resources. By way of example, a media address includes, but is not limited to: the address of a media storage location, a physical memory unit, a collection of physical memory units (e.g., a logical memory unit), a portion of a memory unit (e.g., a logical memory unit address and offset, range, and/or extent), or the like. Accordingly, the SML 130 may map logical addresses to physical data resources of any size and/or granularity, which may or may not correspond to the underlying data partitioning scheme of the non-volatile memory device(s) 120. For example, in some embodiments, the non-volatile memory controller 124 is configured to store data within logical memory units that are formed by logically combining a plurality of physical memory units, which may allow the non-volatile memory controller 124 to support many different virtual memory unit sizes and/or granularities.

As used herein, a logical memory element refers to a set of two or more non-volatile memory elements that are or are capable of being managed in parallel (e.g., via an I/O and/or control bus). A logical memory element may comprise a plurality of logical memory units, such as logical pages, logical memory divisions (e.g., logical erase blocks), and so on. As used herein, a logical memory unit refers to a logical construct combining two or more physical memory units, each physical memory unit on a respective non-volatile memory element in the respective logical memory element (e.g., each non-volatile memory element being accessible in parallel). As used herein, a logical memory division refers to a set of two or more physical memory divisions, each physical memory division on a respective non-volatile memory element in the respective logical memory element.

The logical address space 134 presented by the SML 130 may have a logical capacity, which may correspond to the number of available logical addresses in the logical address space 134 and the size and/or granularity of the data referenced by the logical addresses. For example, the logical capacity of a logical address space 134 comprising $2^{32}$ unique logical addresses, each referencing 2048 bytes (2 KiB) of data may be $2^{43}$ bytes. As used herein, a kibibyte (KiB) refers to 1024 bytes. In some embodiments, the logical address space 134 may be thinly provisioned. As used herein, a "thinly provisioned" logical address space 134 refers to a logical address space 134 having a logical capacity that exceeds the physical capacity of the underlying non-volatile memory device(s) 120. For example, the SML 130 may present a 64-bit logical address space 134 to the storage clients 116 (e.g., a logical address space 134 referenced by 64-bit logical addresses), which may exceed the physical capacity of the underlying non-volatile memory devices 120. The large logical address space 134 may allow storage clients 116 to allocate and/or reference contiguous ranges of logical addresses, while reducing the chance of naming conflicts. The SML 130 may leverage the any-to-any mappings between logical addresses and physical storage resources to manage the logical address space 134 independently of the underlying physical storage devices 120. For example, the SML 130 may add and/or remove physical storage resources seamlessly, as needed, and without changing the logical addresses used by the storage clients 116.

The non-volatile memory controller 124 may be configured to store data in a contextual format. As used herein, a contextual format refers to a self-describing data format in which persistent contextual metadata is stored with the data on the physical storage media 122. The persistent contextual metadata provides context for the data with which it is stored. In certain embodiments, the persistent contextual metadata uniquely identifies the data with which the persistent contextual metadata is stored. For example, the persistent contextual metadata may uniquely identify a sector or block of data owned by a storage client 116 from other sectors or blocks of data owned by the storage client 116. In a further embodiment, the persistent contextual metadata identifies an operation that is performed on the data. In a further embodiment, the persistent contextual metadata identifies a sequence of operations performed on the data. In a further embodiment, the persistent contextual metadata identifies security controls, a data type, or other attributes of the data. In a certain embodiment, the persistent contextual metadata identifies at least one of a plurality of aspects, including data type, a unique data identifier, an operation, and a sequence of operations performed on the data.

The persistent contextual metadata may include, but is not limited to: a logical address of the data, an identifier of the data (e.g., a file name, object id, label, unique identifier, or the like), reference(s) to other data (e.g., an indicator that the data is associated with other data), a relative position or offset of the data with respect to other data (e.g., file offset, etc.), data size and/or range, and the like. The contextual data format may comprise a packet format comprising a data segment and one or more headers. Alternatively, a contextual data format may associate data with context information in other ways (e.g., in a dedicated index on the non-volatile memory media 122, a memory division index, or the like).

In some embodiments, the contextual data format may allow data context to be determined and/or reconstructed based upon the contents of the non-volatile memory media 122, and independently of other metadata, such as the arbitrary, any-to-any mappings discussed above. Since the media location of data is independent of the logical address of the data, it may be inefficient or impossible to determine the context of data based solely upon the media location or media address of the data. Storing data in a contextual format on the non-volatile memory media 122 may allow data context to be determined without reference to other metadata. For example, the contextual data format may allow the metadata to be reconstructed based only upon the contents of the non-volatile memory media 122 (e.g., reconstruct the any-to-any mappings between logical addresses and media locations).

In some embodiments, the non-volatile memory controller 124 may be configured to store data on one or more asymmetric, write-once media 122, such as solid-state storage media. As used herein, a "write once" storage medium refers to a storage medium that is reinitialized (e.g., erased) each time new data is written or programmed thereon. As used herein, an "asymmetric" storage medium refers to a storage medium 122 having different latencies for different storage operations. Many types of solid-state storage media are asymmetric; for example, a read operation may be much faster than a write/program operation, and a write/program operation may be much faster than an erase operation (e.g., reading the media may be hundreds of times faster than erasing, and tens of times faster than programming the media).

The memory media 122 may be partitioned into memory divisions that can be erased as a group (e.g., erase blocks) in order to, inter alia, account for the asymmetric properties of the media 122 or the like. As such, modifying a single data segment in-place may require erasing the entire erase block comprising the data, and rewriting the modified data to the erase block, along with the original, unchanged data. This may result in inefficient "write amplification," which may excessively wear the media 122. Therefore, in some embodiments, the non-volatile memory controller 124 may be configured to write data out-of-place. As used herein, writing data "out-of-place" refers to writing data to different media storage location(s) rather than overwriting the data "in-place" (e.g., overwriting the original physical location of the data). Modifying data out-of-place may avoid write amplification, since existing, valid data on the erase block with the data to be modified need not be erased and recopied. Moreover, writing data out-of-place may remove erasure from the latency path of many storage operations (e.g., the erasure latency is no longer part of the critical path of a write operation).

The non-volatile memory controller 124 may comprise one or more processes that operate outside of the regular path for servicing of storage operations (e.g., the "path" for performing a storage operation and/or servicing a storage request). As used herein, the "path for servicing a storage request" or "path for servicing a storage operation" (also referred to as the "critical path") refers to a series of processing operations needed to service the storage operation or request, such as a read, write, modify, or the like. The path for servicing a storage request may comprise receiving the request from a storage client 116, identifying the logical addresses of the request, performing one or more storage operations on non-volatile memory media 122, and returning a result, such as acknowledgement or data. Processes that occur outside of the path for servicing storage requests may include, but are not limited to: a groomer, de-duplication, and so on. These processes may be implemented autonomously and in the background, so that they do not interfere with or impact the performance of other storage operations and/or requests. Accordingly, these processes may operate independent of servicing storage requests.

In some embodiments, the non-volatile memory controller 124 comprises a groomer, which is configured to reclaim memory divisions (e.g., logical or physical erase blocks) for reuse, using a garbage collection or other storage capacity recovery process. The write out-of-place paradigm implemented by the non-volatile memory controller 124 may result in obsolete or invalid data remaining on the non-volatile memory media 122. For example, overwriting data X with data Y may result in storing Y on a new memory division (e.g., rather than overwriting X in place), and updating the any-to-any mappings of the metadata to identify Y as the valid, up-to-date version of the data. The obsolete version of the data X may be marked as invalid, but may not be immediately removed (e.g., erased), since, as discussed above, erasing X may involve erasing an entire memory division, which is a time-consuming operation and may result in write amplification. Similarly, data that is no longer is use (e.g., deleted or trimmed data) may not be immediately removed. The non-volatile memory media 122 may accumulate a significant amount of invalid data.

A groomer process may operate outside of the critical path for servicing storage operations. The groomer process may reclaim memory divisions so that they can be reused for other storage operations. As used herein, reclaiming a memory division refers to erasing the memory division so that new data may be stored/programmed thereon. Reclaiming a memory division may comprise relocating valid data on the memory division to a new location. The groomer may identify memory divisions for reclamation based upon one or more factors, which may include, but are not limited to: the amount of invalid data in the memory division, the amount of valid data in the memory division, wear on the memory division (e.g., number of erase cycles), time since the memory division was programmed or refreshed, and so on.

The non-volatile memory controller 124 may be further configured to store data in a log format. As described above, a log format refers to a data format that defines an ordered sequence of storage operations performed on a non-volatile memory media 122. In some embodiments, the log format comprises storing data in a pre-determined sequence of media addresses of the non-volatile memory media 122 (e.g., within sequential pages and/or erase blocks of the media 122). The log format may further comprise associating data (e.g., each packet or data segment) with respective sequence indicators. The sequence indicators may be applied to data individually (e.g., applied to each data packet) and/or to data groupings (e.g., packets stored sequentially on a memory division, such as an erase block). In some embodiments, sequence indicators may be applied to memory divisions when the memory divisions are reclaimed (e.g., erased), as described above, and/or when the memory divisions are first used to store data.

In some embodiments the log format may comprise storing data in an "append only" paradigm. The non-volatile memory controller 124, using the log storage module 137 described below or the like, may maintain a current append point at a media address of the non-volatile memory device 120. The append point may be a current memory division and/or offset within a memory division. Data may then be sequentially appended from the append point. The sequential ordering of the data, therefore, may be determined based upon the sequence indicator of the memory division of the data in combination with the sequence of the data within the memory division. Upon reaching the end of a memory division, the non-volatile memory controller 124 may identify the "next" available memory division (e.g., the next memory division that is initialized and ready to store data). The groomer may reclaim memory divisions comprising invalid, stale, and/or deleted data, to ensure that data may continue to be appended to the media log.

The log format described herein may allow valid data to be distinguished from invalid data based upon the contents of the non-volatile memory media 122, and independently of other metadata. As discussed above, invalid data may not be removed from the non-volatile memory media 122 until the memory division comprising the data is reclaimed. Therefore, multiple "versions" of data having the same context may exist on the non-volatile memory media 122 (e.g., multiple versions of data having the same logical addresses). The sequence indicators associated with the data may be used to distinguish invalid versions of data from the current, up-to-date version of the data; the data that is the most recent in the log is the current version, and previous versions may be identified as invalid.

The storage management layer 130 may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

The storage management layer 130 comprises and/or is communicatively coupled to one or more non-volatile memory devices 120. The one or more non-volatile memory devices 120 may include different types of non-volatile memory devices including, but not limited to: solid-state storage devices, hard drives, SAN storage resources, or the like. The one or more non-volatile memory devices 120 may comprise one or more respective non-volatile memory media controllers 126 and non-volatile memory media 122. As illustrated in FIG. 1, The SML 130 may provide access to the one or more non-volatile memory devices 120 via a traditional block I/O interface 131. Additionally, the SML 130 may provide access to enhanced functionality (e.g., a large, virtual address space 134) through the SML interface 132. The metadata 135 may be used to manage and/or track storage operations performed through any of the Block I/O interface 131, SML interface 132, cache interface 133, or other, related interfaces.

The cache interface 133 may expose cache-specific features accessible via the storage management layer 130. Also, in some embodiments, the SML interface 132 presented to the storage clients 116 provides access to data transformations implemented by the one or more non-volatile memory devices 120 and/or the one or more non-volatile memory media controllers 126.

The SML 130 may provide storage services through one or more interfaces, which may include, but are not limited to: a block I/O interface, an extended storage management layer interface, a cache interface, and the like. The SML 130 may present a logical address space 134 to the storage clients 116 through one or more interfaces. As discussed above, the logical address space 134 may comprise a plurality of logical addresses, each corresponding to respective media locations the on one or more non-volatile memory devices 120. The SML 130 may maintain metadata 135 comprising any-to-any mappings between logical addresses and media locations, as described above.

The SML 130 may further comprise a log storage module 137 that is configured to store data in a contextual, log format. The contextual, log data format may comprise associating data with persistent contextual metadata, such as the logical address of the data, or the like. The contextual, log format may further comprise associating data with respective sequence identifiers on the non-volatile memory media 122, which define an ordered sequence of storage operations performed on the one or more non-volatile memory devices 120, as described above.

The SML 130 may further comprise a non-volatile memory device interface 139 configured to transfer data, commands, and/or queries to the one or more non-volatile memory devices 120 over a bus 125, which may include, but is not limited to: a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the non-volatile memory controller 124 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The non-volatile memory controller 124 comprises one or more non-volatile memory devices 120. Although FIG. 1 depicts a single non-volatile memory device 120, the disclosure is not limited in this regard and could be adapted to incorporate any number of non-volatile memory devices 120.

The non-volatile memory device 120 may comprise non-volatile memory media 122, which may include but is not limited to: NAND flash memory, NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONO S), resistive RAM (RRAM), programmable metallization cell (PMC), conductive-bridging RAM (CBRAM), magneto-resistive RAM (MRAM), dynamic RAM (DRAM), phase change RAM (PRAM or PCM), magnetic storage media (e.g., hard disk, tape), optical storage media, or the like. While the non-volatile memory media 122 is referred to herein as "memory media," in various embodiments, the non-volatile memory media 122 may more generally comprise a non-volatile recording media capable of recording data, which may be referred to as a non-volatile memory media, a non-volatile storage media, or the like. Further, the non-volatile memory device 120, in various embodiments, may comprise a non-volatile recording device, a non-volatile memory device, a non-volatile storage device, or the like.

The non-volatile memory media 122 may comprise one or more non-volatile memory elements 123, which may include, but are not limited to: chips, packages, planes, die, and the like. A non-volatile memory media controller 126 may be configured to manage storage operations on the non-volatile memory media 122, and may comprise one or more processors, programmable processors (e.g., field-programmable gate arrays), or the like. In some embodiments, the non-volatile memory media controller 126 is configured to store data on and/or read data from the non-volatile memory media 122 in the contextual, log format described above, and to transfer data to/from the non-volatile memory device 120, and so on.

The non-volatile memory media controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the non-volatile memory media controller 126 in parallel. This parallel access may allow the non-volatile memory elements 123 to be managed as a group, forming a logical memory element 129. As discussed above, the logical memory element may be partitioned into respective logical memory units (e.g., logical pages) and/or logical memory divisions (e.g., logical erase blocks). The logical memory units may be formed by logically combining physical memory units of each of the non-volatile memory elements. For example, if the non-volatile memory media 122 comprises twenty-five (25) non-volatile memory elements, each logical memory unit may comprise twenty-five (25) pages (e.g., a page of each element of non-volatile memory media 122).

The non-volatile memory controller 124 may comprise an SML 130 and the non-volatile memory media controller 126. The SML 130 may provide storage services to the storage clients 116 via one or more interfaces 131, 132, and/or 133. In some embodiments, the SML 130 provides a block-device I/O interface 131 through which storage clients 116 perform block-level I/O operations. Alternatively, or in addition, the SML 130 may provide a storage management layer (SML) interface 132, which may provide other storage services to the storage clients 116. In some embodiments, the SML interface 132 may comprise extensions to the block device interface 131 (e.g., storage clients 116 may access the SML interface 132 through extensions to the block device interface 131). Alternatively, or in addition, the SML interface 132 may be provided as a separate API, service, and/or library. The SML 130 may be further configured to provide a cache interface 133 for caching data using the non-volatile memory system 102.

As described above, the SML 130 may present a logical address space 134 to the storage clients 116 (e.g., through the interfaces 131, 132, and/or 133). The SML 130 may maintain metadata 135 comprising any-to-any mappings between logical addresses in the logical address space 134 and media locations on the non-volatile memory device 120. The metadata 135 may comprise a logical-to-physical mapping structure with entries that map logical addresses in the logical address space 134 and media locations on the non-volatile memory device 120. The logical-to-physical mapping structure of the metadata 135, in one embodiment, is sparsely populated, with entries for logical addresses for which the non-volatile memory device 120 stores data and with no entries for logical addresses for which the non-volatile memory device 120 does not currently store data. The metadata 135, in certain embodiments, tracks data at a block level, with the SML 130 managing data as blocks.

The non-volatile memory system 102 may further comprise a log storage module 137, which, as described above, may be configured to store data on the non-volatile memory device 120 in a contextual, log format. The contextual, log data format may comprise associating data with a logical address on the non-volatile memory media 122. The contextual, log format may further comprise associating data with respective sequence identifiers on the non-volatile memory media 122, which define an ordered sequence of storage operations performed on the non-volatile memory media 122, as described above. The non-volatile memory controller 124 may further comprise a non-volatile memory device interface 139 that is configured to transfer data, commands, and/or queries to the non-volatile memory media controller 126 over a bus 125, as described above.

Figure 2:
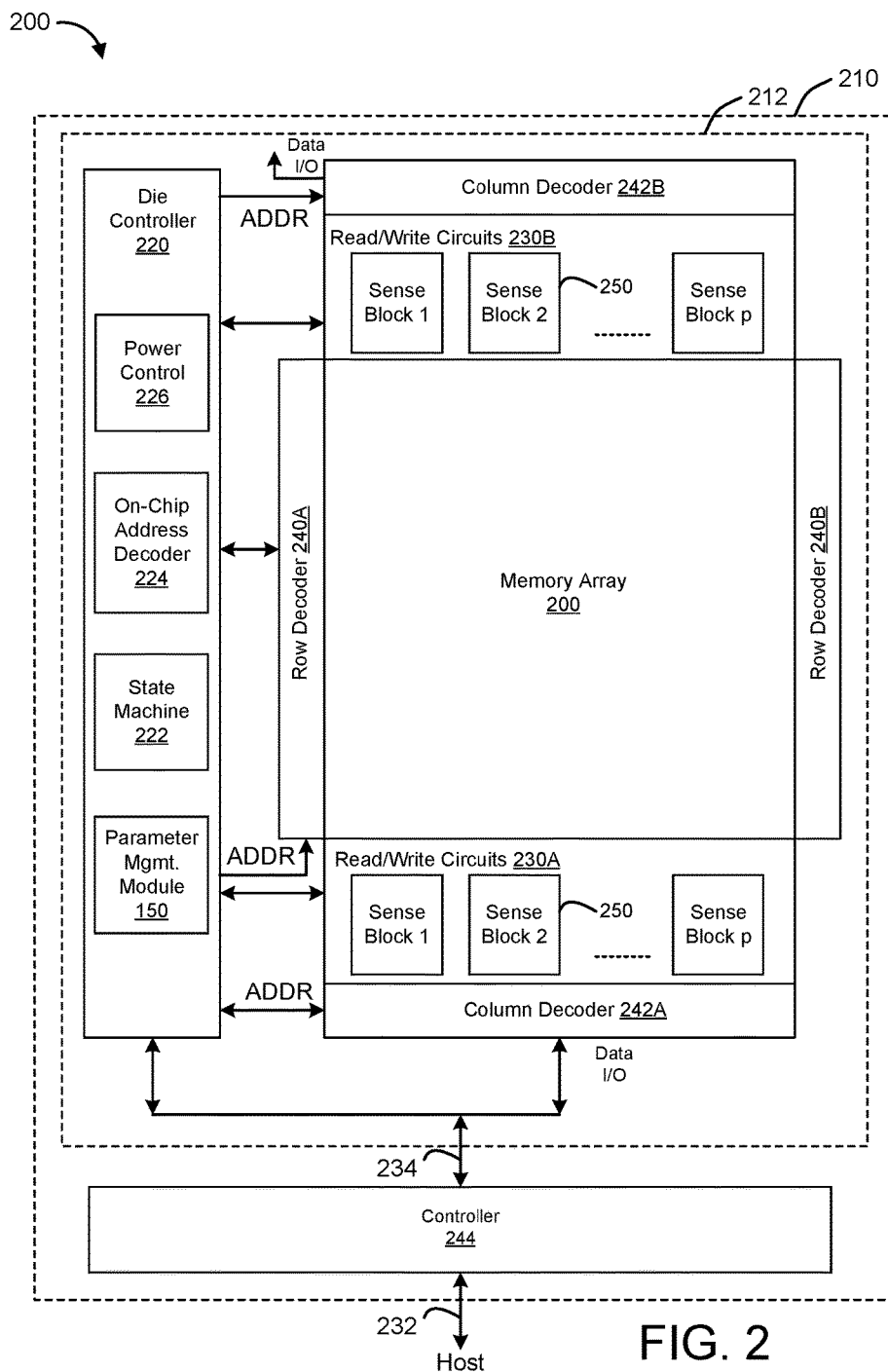
FIG. 2 is a schematic block diagram illustrating one embodiment of a memory element.

FIG. 2 depicts an embodiment of a non-volatile storage device 210 that may include one or more memory die or chips 212. The non-volatile storage device 210 may be substantially similar to the non-volatile memory device 120 described with reference to FIG. 1. Memory die 212, in some embodiments, includes an array 200 (two-dimensional or three dimensional) of memory cells, die controller 220, and read/write circuits 230A/230B. In one embodiment, access to the memory array 200 by the various peripheral circuits is implemented in a symmetric fashion, on opposite sides of the array, so that the densities of access lines and circuitry on each side are reduced by half. The read/write circuits 230A/230B, in a further embodiment, include multiple sense blocks 250 which allow a page of memory cells to be read or programmed in parallel.

The memory array 200, in various embodiments, is addressable by word lines via row decoders 240A/240B and by bit lines via column decoders 242A/242B. In some embodiments, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Die controller 220, in one embodiment, cooperates with the read/write circuits 230A/230B to perform memory/storage operations on the memory array 200. The die controller 220, in certain embodiments, includes a parameter management module 150, a state machine 222, an on-chip address decoder 224, and a power control circuit 226. The parameter management module 150, in one embodiment, is configured to receive a command to change a value of a parameter associated with a non-volatile storage device 120. In certain embodiments, the parameter includes a setting for one or more storage operations of the non-volatile storage device 120. In some embodiments, the parameter management module 150 is configured to receive one or more data sets with the command. A data set may include an identifier associated with a parameter that is to be changed and a new value for the parameter. Each of the data sets, in one embodiment, are received at a same data rate as the command. In a further embodiment, for each of the one or more data sets, the new value for the parameter is written to a storage location associated with the parameter. The parameter management module 150, in certain embodiments, may include software of a device driver, and/or hardware in a device controller 244, a die controller 220 and/or state machine 222.

The state machine 222, in one embodiment, provides chip-level control of memory or storage operations. The on-chip address decoder 224 provides an address interface to convert between the address that is used by the host or a memory controller to the hardware address used by the decoders 240A, 240B, 242A, 242B. The power control circuit 226 controls the power and voltages supplied to the word lines and bit lines during memory operations. In one embodiment, power control circuit 226 includes one or more charge pumps that can create voltages larger than the supply voltage.

Figure 3:
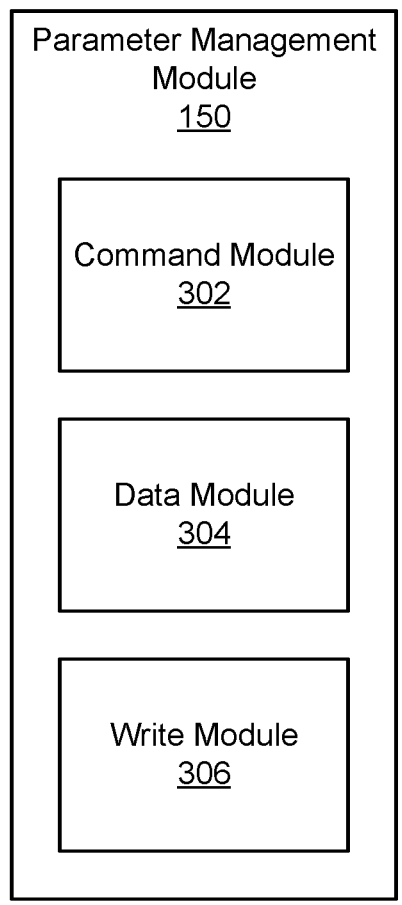
FIG. 3 is a schematic block diagram illustrating one embodiment of a parameter management module.

FIG. 3 depicts one embodiment of a parameter management module 150. The parameter management module 150 may be substantially similar to the parameter management module 150 described above with regard to FIG. 1. In the depicted embodiment, the parameter management module 150 includes a command module 302, a data module 304, and a write module 306, which are described in more detail below.

The command module 302, in one embodiment, is configured to receive a command, instruction, signal, or the like, to change a value of a parameter associated with an integrated circuit (IC) memory element, such as a non-volatile storage device 120 as described above. Even though many of the examples are described herein with reference to a non-volatile storage device 120, one of skill in the art will recognize that the subject matter disclosed herein may be applicable to various types of non-volatile and volatile storage devices.

The command module 302, in one embodiment, may receive a command to change, modify, adjust, alter, or the like the value of a parameter associated with an integrated circuit memory element from a storage client 116, a non-volatile memory controller 124, a non-volatile memory media controller 126, a device driver or storage management layer (SML) 130, or the like. A parameter, as used herein, may be a variable, an execution variable, a setting, a storage operation setting, or the like that comprises a value that is used for storage operations, storage functions, or the like on the IC memory element, such as program erase or read operations. Examples of a storage parameter that may be changed may include a read voltage threshold setting, a read bias threshold setting, a verify voltage setting, a program voltage setting, a loop count setting, a step size setting, and/or the like.

The data module 304, in one embodiment, is configured to receive one or more data sets, data tuples, or the like, with the command to change the value of a parameter, a setting, a group of parameters, a group of settings, or the like. Each of the one or more data sets may comprise data for changing the value of a storage parameter. For instance, each data set may include an identifier associated with a storage parameter that is to be changed and the new value for the identified storage parameter. The identifier may include an address, a locally or globally unique identifier, a storage location, and/or the like that identifies a parameter of the IC memory element that is to be changed. The new value for the storage parameter included in a data set may be of various data types such as integers, floats, doubles, character strings, and/or the like. For example, the value for a read voltage threshold parameter may be a value such as 2.8 volts.

In one embodiment, the data module 304 receives the one or more data sets at the same data rate at which the command module 302 receives the command to change a parameter. For example, an IC memory element may be executing in toggle mode, e.g. a DDR mode where data is received at a rate of 200 MB/s, such that the command module 302 receives the parameter change command and the data module 304 receives the one or more data sets at the same data rate. This is unlike conventional memory systems where an IC memory element may be placed in a slower performing mode, e.g., a legacy mode, an SDR mode, or the like, before receiving data for changing one or more parameters of the IC memory element.

For example, in one embodiment, the data module 304 may receive the one or more data sets at a beginning of a clock cycle directly after a final clock cycle where the command module 302 receives the parameter change command. For example, while in toggle mode, 200 Mb/s of data may be received during each clock cycle. The command module 302 may receive the parameter change command during a 200 MB/s clock cycle. The data module 304 may then receive one or more data sets for changing one or more parameters of the IC memory element during the next 200 MB/s clock cycle. Thus, the IC memory element is not placed in a slower performing mode to receive the data sets for changing parameters, but instead remains in the high-performance mode and receives data sets for changing parameters at a same clock cycle rate as the clock cycle rate that the command module 302 received the command.

In another example embodiment, the data module 304 receives each of the one or more data sets without a delay between receipt of each data set. In such an embodiment, for example, the data module 304 may receive each data set for changing parameters during without receiving another parameter change command between receipt of each data set. In another example embodiment, the data module 304 may receive each data set for changing parameters without one or more additional clock cycles in between receipt of each data set. For instance, one or more data sets may be received during the same 200 MB/s clock cycle instead of each data set being sent separately during different clock cycles.

The write module 306, in one embodiment, is configured to write or program the new value for a parameter to a storage location, address, or the like associated with the parameter. The write module 306, in certain embodiments, processes each data set that the data module 304 receives by determining the storage location of the parameter based on the identifier provided in each data set and writes the provided new value to the storage location for the parameter. In such an embodiment, the write module 306 overwrites any existing values or data at the storage location for the parameter. In various embodiments, the storage location may refer to a register or other non-volatile storage location for storing parameters on or associated with an IC memory element.

In certain embodiments, a data set of the one or more data sets further includes a mask, such as a bit mask, that the write module 306 uses to determine storage locations of one or more parameters or settings of a plurality of parameters, a group of settings, or the like, that should be changed to the new value provided in each data set that the data module 304 receives. For instance, a set of parameters may be represented by a byte or other bit string where each bit of the byte or bit string represents at least a portion of a parameter, or at least a portion of a storage location of a parameter. In such an embodiment, each parameter may be stored as one or more bytes, and each bit of the bit string that represents the set of parameters references, points to, indicates a storage location of, or the like at least a portion of a parameter.

For example, the data module 304 may receive a data set that includes an identifier, address, or the like for a bit string representing a set of parameters where each bit represents a different parameter of the set. The data set may also include a bit mask that the write module 306 uses to determine which parameter represented by a bit of the bit string is to be changed. For instance, the write module 304 may perform a logical operation using the bit string representing the set of parameters and the bit mask, such as a logical OR, AND, XOR, or the like, to determine which parameter represented by one or more bits of the bit string is to be changed.

In a specific example, if eight parameters are represented by the bit string 11111111 where each bit refers to a storage location of a parameter (e.g., a parameter value stored in a register), a byte representing the parameter value, or the like, and the data module 304 receives a data set that includes a bit mask of 00010000, the write module 306 may perform a logical XOR operation using the bit string representing the set of parameters and the bit mask (e.g., 11111111 Y 00010000=00010000) to determine that the parameter, or the storage location for the parameter value, represented by the third bit is the parameter value that is to be changed. In this manner, only the parameters specified by the bit mask are loaded/read and changed, instead of loading/reading all of the parameters of the set of parameters that are represented by the bit string.

In some embodiments, the bit string that represents the set of parameters, or the storage locations for the parameters, comprises a plurality of bits that together represent a single parameter value. For example, if the value of a parameter is a value that is greater that a single byte, such as a float or double, then multiple bits combined may represent a single parameter value, or the storage location(s) for the parameter value. For instance, if the parameter value for a read threshold is a double (e.g., 8 bytes or 64 bits) such as 2.8 volts, then each bit of the bit string representing the storage location for this parameter may refer to a storage location of a byte of the eight bytes required to store the parameter value.

Figure 4:
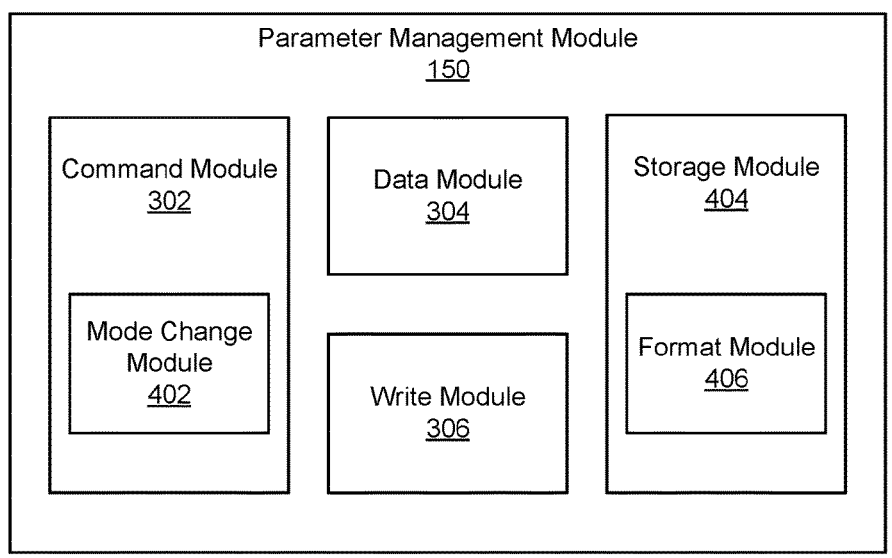
FIG. 4 is a schematic block diagram illustrating another embodiment of a parameter management module.

FIG. 4 depicts one embodiment of a parameter management module 150. The parameter management module 150 may be substantially similar to the parameter management module 150 described above with regard to FIG. 1. In the depicted embodiment, the parameter management module 150 includes a command module 302, a data module 304, and a write module 306, which may be substantially similar to the command module 302, the data module 304, and the write module 306 described above with reference to FIG. 3. In a further embodiment, the parameter management module 150 includes a mode change module 402, a storage module 404, and a format module 406, which are described in more detail below.

The command module 302, in one embodiment, includes an embodiment of a mode change module 402. The mode change module 402, in one embodiment, receives a command to place the IC memory element in a test mode, an internal mode, and/or the like. As used herein, a test or internal mode of an IC memory element may refer to an operating or execution mode of the IC memory element for receiving and/or processing management commands associated with storage operations of the IC memory element. For example, changing storage operation parameters for an IC memory element may be performed while the IC memory element is placed in a test or internal mode. In various embodiments, the command module 302 receives the command to change a storage parameter, and the data module 304 receives the one or more data sets for changing storage parameters, after the mode change module 402 receives the command to place the IC memory element in test mode and then places the IC memory element in test mode.

For example, the mode change module 402 may receive a command to place a NAND flash storage device in test mode, such as command '5CC5'. The mode change module 402 may place the NAND flash storage device in a test/internal mode after receiving the '5CC5' command, and then the command module 302 may receive a command to change storage parameters. The data module 304 may then receive one or more data sets for changing the storage parameters. Of note is that this is handled while the NAND flash storage device is operating in a high-speed or high-performance mode, such as toggle mode or DDR mode such that the parameter change command and the data sets for changing storage parameters are received at the same high-speed data rate instead of placing the NAND flash storage device in a slower mode, such as SDR mode.

In certain embodiments, the mode change module 402 receives a termination command that indicates that the IC memory element should be taken out of test/internal mode and placed in regular operating mode. For example, the write module 306 may send a termination command to the mode change module 402 to indicate that it is finished changing parameter values and that the IC memory element can return to normal operating mode.

The storage module 404, in one embodiment, is configured to store the one or more data sets that the data module 304 receives in one or more data latches associated with an IC memory element. A data latch, as used herein, refers to a storage area of the IC memory element used for storing data until it is written or read to/from the IC memory element. In certain embodiments, the data latch that the storage module 404 uses is a main data point-of-entry into and out of an IC memory element. Examples of data latches that the storage module 404 uses to store the one or more data sets may include ADL, BDL, CDL, XDL, and/or the like. In this manner, the data can be stored in existing storage on the IC memory element without requiring extra storage.

In one embodiment, the storage module 404 stores the one or more data sets in one or more data latches prior to the write module 306 writing the new parameter values in the data sets to the IC memory element. In various embodiments, the storage module 404 includes a format module 406 that is configured to format the one or more received data sets prior to the storage module 404 storing the data sets in the data latches. The format module 406, in some embodiments, formats the one or more received data sets as one or more bit strings that have a predefined format. For example, for each data set, the format module 406 may format a bit string as (Parameter Identifier)(Bit Mask)(New Value) and the storage module 404 may store each bit string in one or more data latches. The bit strings may be stored in adjacent storage locations (e.g., as one long bit string) or in separate storage locations (e.g., as separate bit strings). For instance, the format module 406 may include one or more bits as offsets, padding, and/or the like between data sets, before data sets, after data sets, and/or the like.

The storage module 404 may be further configured to track, determine, or otherwise identify how many data sets are stored in the data latches. In this manner, the write module 306 can determine how many data sets have been stored in the data latches, and can iterate through the data sets the determined number of times to change the parameter values for each parameter associated with each data set. For instance, for each data set, the write module 306 may read a data set from the data latches according to the predefined data format, determine the parameter to be changed based on the parameter identifier and/or the bit mask, and write the new value to the storage location for the parameter. In some embodiments, the write module 306 may read groups of data within a single clock cycle to modify parameters, settings, execution variables, and/or the like of the IC memory element.

Figure 5:
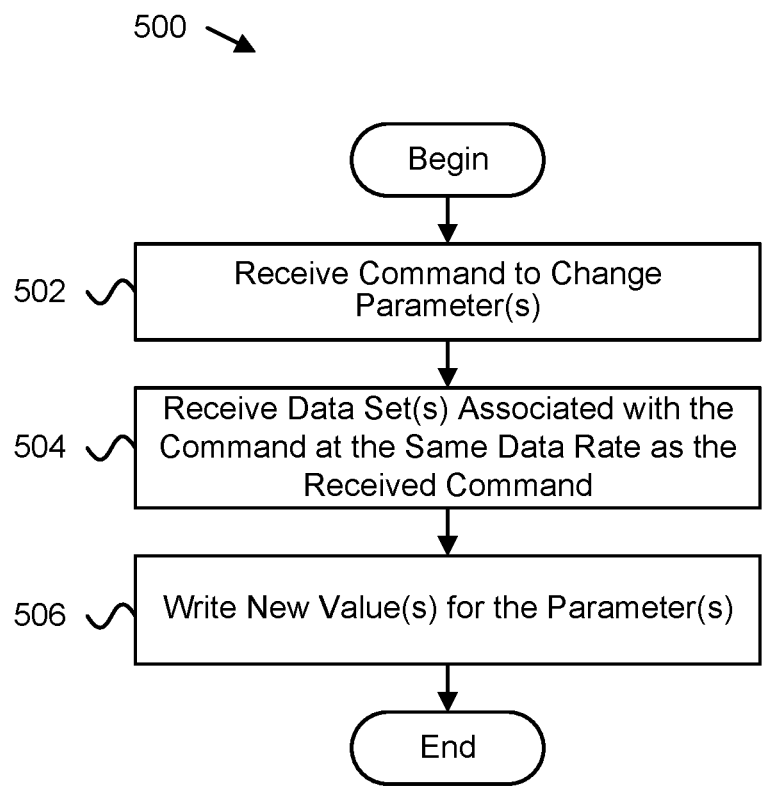
FIG. 5 is a schematic flow chart diagram illustrating one embodiment of a method for changing storage parameters.

FIG. 5 is a schematic flow chart diagram illustrating one embodiment of a method 500 for changing storage parameters. In one embodiment, the method 500 begins and the command module 302 receives 502 a command to change a value of a parameter of an IC memory element. The parameter may include a setting for one or more storage operations of the IC memory element.

The data module 304, in a further embodiment, receives 504 one or more data sets with the command. A data set of the one or more data sets may include an identifier associated with a parameter to be changed and a new value for the parameter. Each of the one or more data sets are received 504 at a same data rate as the command, e.g., a toggle mode or DDR mode data rate.

The write module 306, in one embodiment, for each of the one or more data sets, writes 506 the new value for the parameter to a storage location associated with the parameter, and the method 500 ends.

Figure 6:
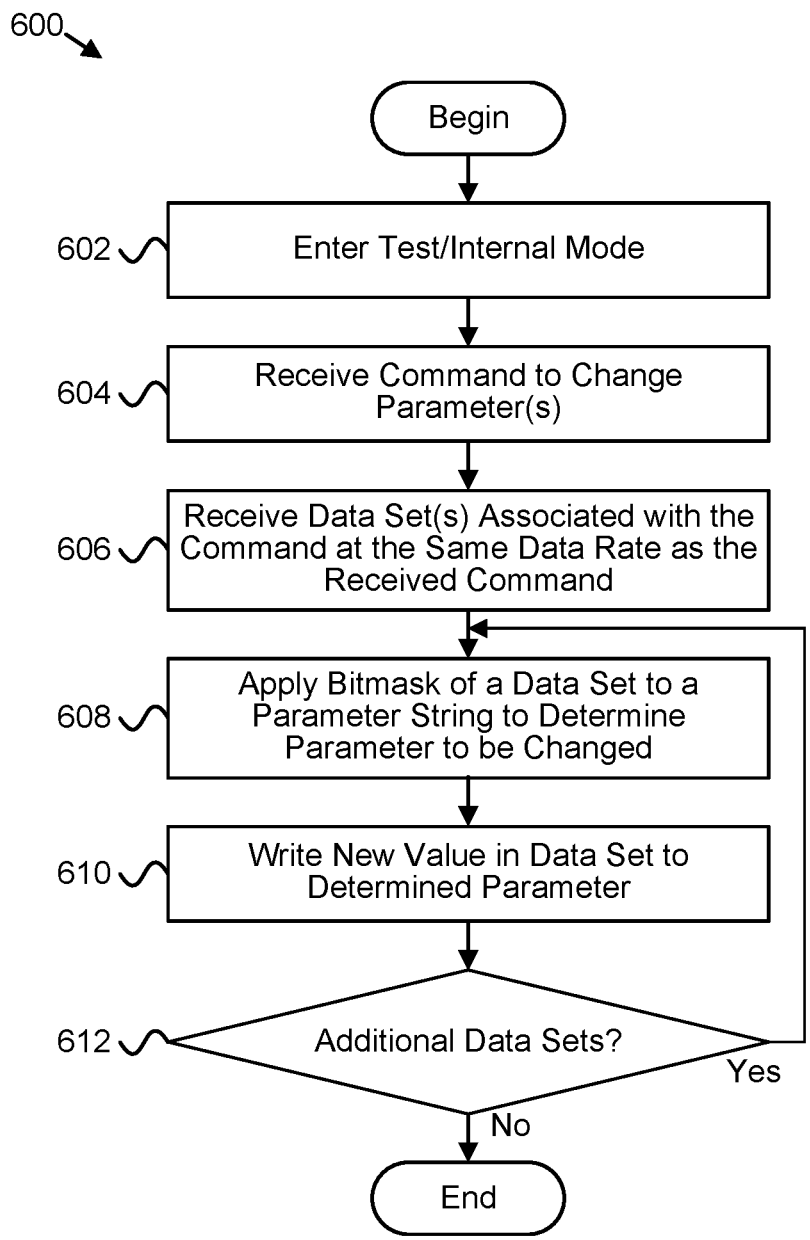
FIG. 6 is a schematic flow chart diagram illustrating a further embodiment of a method for changing storage parameters.

FIG. 6 is a schematic flow chart diagram illustrating a further embodiment of a method 600 for changing storage parameters. In one embodiment, the method 600 begins and the mode change module 402 receives a command to place the IC memory element in a test/internal mode, and places 602 the IC memory element in the test/internal mode. In a further embodiment, the command module 302 receives 604 a command to change a value of a parameter of an IC memory element.

In one embodiment, the data module 304 receives 606 one or more data sets with the command at the same data rate as the command. In some embodiments, the write module 306 applies 608 a bit mask provided in a data set to a parameter string, which is identified by the identifier in the data set, to determine which parameter of the parameter string to change to the new value that is included in the data set.

In some embodiments, the write module 306 writes 610 the new value for the parameter to a storage location associated with the determined parameter. The write module 306 determines 612 whether there are additional data sets to be processed for changing different parameters. If there are additional data sets, then the write module 306 applies 608 the bitmask of a data set to determine another parameter and writes 610 the new value to the parameter. The write module 306 does this for each data set that the data module 304 received, and the method 600 ends when the write module 306 determines 612 that there are no more additional data sets to process.

Figure 7:
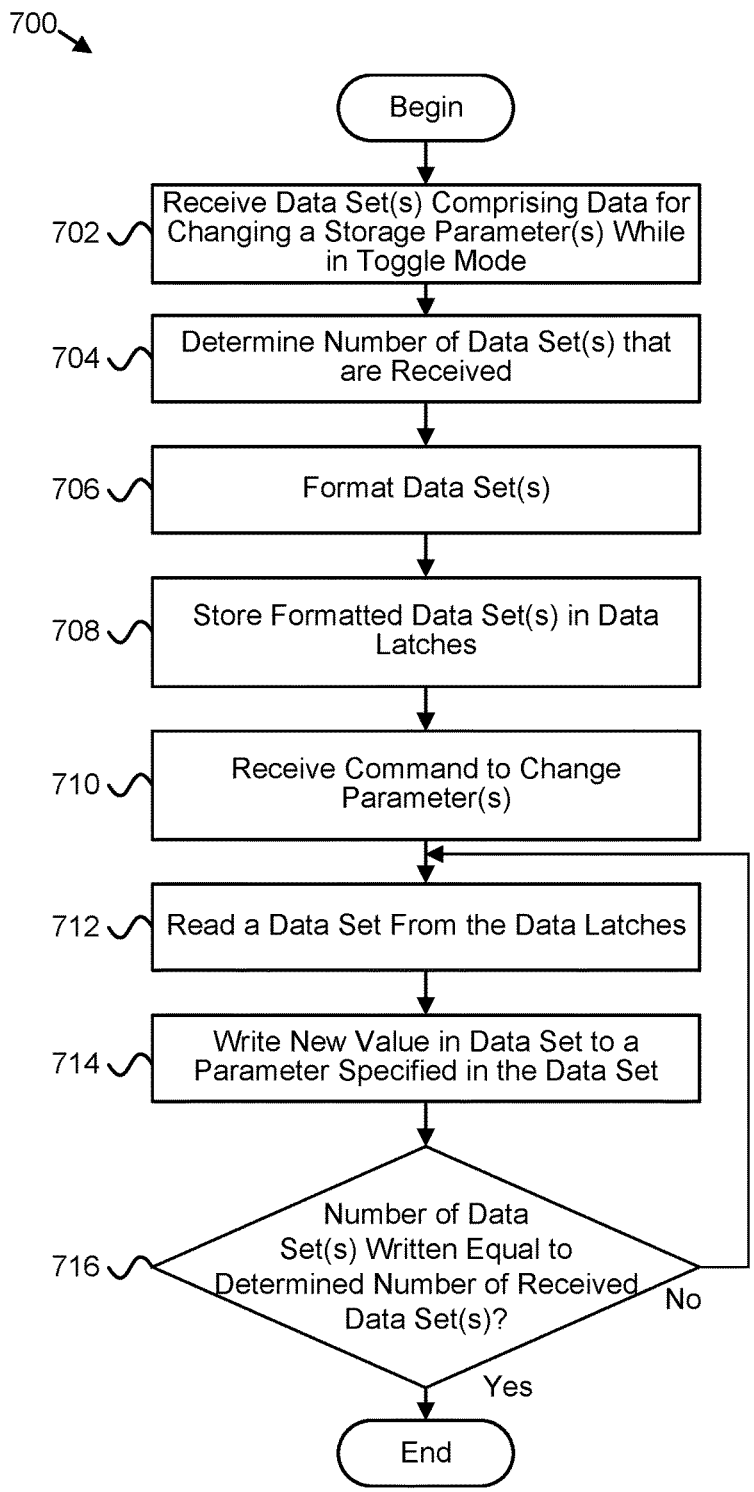
FIG. 7 is a schematic flow chart diagram illustrating another embodiment of a method for changing storage parameters.

FIG. 7 is a schematic flow chart diagram illustrating another embodiment of a method 700 for changing storage parameters. In one embodiment, the method 700 begins and the data module 302 receives 702 one or more data sets that include data for changing one or more storage parameters of an IC memory element. In certain embodiments, the data module 302 receives 702 the one or more data sets while the IC memory element executes in toggle mode, e.g., in a high-speed data rate mode such as DDR.

In a further embodiment, the data module 302 determines 704 the number of data sets that are received. In some embodiments, the format module 406 formats 706 the data sets for storage in one or more data latches. The format module 406, for example, may format each data set as a bit string with a predefined format, order, arrangement, organization, or the like, such as a bit string with the following order of data fields: (Parameter Identifier)(Bit Mask)(New Value).

The storage module 404, in one embodiment, stores 708 the formatted data sets in one or more data latches associated with the IC memory element. In a further embodiment, the command module 302 receives 710 a command to change the parameters. In response to receiving the parameter change command, the write module 306 reads 712 a data set from the data latches, determines the parameter to be changes (using the identifier in the data set and/or the bitmask in the data set), and writes 714 the new value for the parameter in the data set to the storage location for the parameter.

The write module 306 determines 716 whether the number of data sets that have been written to the storage location for the parameter is equal to the number of data sets that the data module 304 received, and which are stored in the data latches. If not, the write module 306 reads 712 the next data set from the data latches, and writes 714 the new value in the data set to the storage location for the parameter associated with the data set. The write module 306 does this for each data set that the data module 304 received, and the method 700 ends when the write module 306 determines 716 that the number of data sets that have been written to the storage locations for the parameters is equal to the number of data sets that the data module 304 received.

A means for receiving a command for changing storage parameters, in various embodiments, may include a command module 302, a parameter management module 150, a non-volatile storage device interface 139, a non-volatile memory medium controller 126, a storage client 116, a host computing device 110, a bus 127, a network 115, a controller (e.g., a die controller 220, a state machine 222, a controller 244, a device driver, or the like), a sense amplifier 250, a voltage source, a processor 111, other logic hardware, and/or other executable code stored on a computer readable storage medium. Other embodiments may include similar or equivalent means for receiving a command for changing storage parameters.

A means for receiving one or more data sets for changing storage parameters, may include a data module 304, a parameter management module 150, a non-volatile storage device interface 139, a non-volatile memory medium controller 126, a storage client 116, a host computing device 110, a bus 127, a network 115, a controller (e.g., a die controller 220, a state machine 222, a controller 244, a device driver, or the like), a sense amplifier 250, a voltage source, a processor 111, other logic hardware, and/or other executable code stored on a computer readable storage medium. Other embodiments may include similar or equivalent means for receiving one or more data sets for changing storage parameters.

A means for writing new values to storage parameters, in various embodiments, may include a write module 306, a parameter management module 150, a non-volatile storage device interface 139, a non-volatile memory medium controller 126, a storage client 116, a host computing device 110, a bus 127, a network 115, a controller (e.g., a die controller 220, a state machine 222, a controller 244, a device driver, or the like), a sense amplifier 250, a voltage source, a processor 111, other logic hardware, and/or other executable code stored on a computer readable storage medium. Other embodiments may include similar or equivalent means for writing new values to storage parameters.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus comprising:
an integrated circuit ("IC") memory element configured to:
receive, during a first set of one or more clock cycles in a double data rate mode, a command to change a value of a parameter associated with the IC memory element, the parameter comprising a setting for one or more storage operations of the IC memory element;
receive, during a second set of one or more clock cycles after the first set of one or more clock cycles, one or more data sets with the command, the second set of one or more clock cycles operating in the same double data rate mode as the first set of one or more clock cycles, a data set of the one or more data sets comprising a mask that identifies the parameter to be changed and a new value for the parameter; and
for each of the one or more data sets, write the new value for the parameter to a storage location associated with the parameter.

2. The apparatus of claim 1, wherein receiving the one or more data sets with the command comprises receiving the one or more data sets at a beginning of a clock cycle directly after a final clock cycle for receiving the command.

3. The apparatus of claim 1, wherein the IC memory element is further configured to store the one or more data sets in one or more data latches associated with the IC memory element prior to writing the new value of each of the one or more data sets to the storage location associated with each parameter that is being changed.

4. The apparatus of claim 3, wherein each of the one or more received data sets are formatted as a bit string prior to being stored in the one or more latches.

5. The apparatus of claim 4, wherein the IC memory element is further configured to receive a value representing a number of data sets comprising the bit string that is stored in the one or more latches.

6. The apparatus of claim 3, wherein the IC memory element is further configured to access the one or more data sets stored in the one or more data latches and write the new value of each of the one or more data sets to the storage location associated with each parameter without being placed in a test mode.

7. The apparatus of claim 1, wherein the one or more data sets are received without a time delay between receipt of each data set.

8. The apparatus of claim 1, wherein the one or more data sets are received without one or more additional clock cycles in between receipt of each data set.

9. The apparatus of claim 1, wherein the mask comprises a bit mask used for determining one or more parameters of a plurality of parameters that should be changed to the new value.

10. The apparatus of claim 9, wherein the plurality of parameters is represented by a bit string associated with the identifier, each bit of the bit string representing at least a portion of a parameter, the IC memory element further configured to perform a logical operation using the bit string and the bit mask to determine which parameters represented by the bits of the bit string should be changed to the new value.

11. The apparatus of claim 1, wherein the IC memory element receives the command after being placed in a test mode, the test mode comprising a mode of the IC memory element for receiving management commands associated with storage operations of the IC memory element.

12. A system comprising:
a non-volatile memory medium executing in a toggle mode; and
a controller configured to:
receive, in the toggle mode, a plurality of data tuples for changing values of storage operation settings for the non-volatile memory medium, each data tuple comprising an address for a group of settings, a mask for identifying which setting of the group is to be changed, and a value for the identified setting, the plurality of data tuples received without a delay between receiving each data tuple of the plurality of data tuples; and
program the values of the data tuples to the settings for the non-volatile memory medium identified by the masks of the data tuples.

13. The apparatus of claim 12, wherein the controller is further configured to receive the plurality of data tuples after receiving an instruction to change the values of the storage operation settings.

14. The apparatus of claim 13, wherein receiving the plurality of tuples without a delay between receiving each data tuple of the plurality of tuples comprises receiving the one or more data tuples at a beginning of a clock cycle directly after a final clock cycle for receiving the instruction.

15. The apparatus of claim 13, wherein the controller is further configured to store the plurality of data tuples in one or data latches of the non-volatile memory medium, the plurality of data tuples being read from the one or more data latches in response to executing the instruction to change the values of the storage operation settings.

16. The apparatus of claim 15, wherein the controller is further configured to format each of the plurality of data tuples into a pre-defined data format prior to storing the data tuples in the one or more data latches.

17. The apparatus of claim 15, wherein the controller is further configured to access the plurality of data tuples stored in the one or more data latches and program the values of each of the plurality of data tuples for the storage operation settings without being placed in a management mode.

18. The apparatus of claim 12, wherein a settings group is represented by a bit string such that each bit of the bit string represents a different setting of the settings group, the controller further configured to apply the mask to the bit string to determine which setting value to change for each data tuple of the plurality of data tuples.

19. The apparatus of claim 12, wherein the controller is further configured to receive an instruction to place the non-volatile memory medium in a management mode, the management mode comprising a mode of the non-volatile memory medium for changing storage operation settings of the non-volatile memory medium.

20. An apparatus comprising:
   means for reading, within a single clock cycle of a set of one or more clock cycles in a double data rate mode, groups of data for modifying one or more execution variables of a non-volatile storage device from one or more data latches of the non-volatile storage device, the execution variables associated with one or more functions of the non-volatile storage device;
   means for identifying the execution variables of the non-volatile storage device that are to be modified according to a mask within the groups of data that identifies the parameter to be changed; and
   means for modifying the identified execution variables to different values provided within the groups of data.

* * * * *